United States Patent

Kai et al.

[15] 3,644,120

[45] Feb. 22, 1972

[54] PHOTOSENSITIVE COMPOSITIONS

[72] Inventors: Tsunetoshi Kai, 328 Mizonuma, Asaka-cho, Kitaadachi-gun, Saitama-ken; Mitsuhiro Inoue, 27-6, 3-chome, Nakadai, Itabashi-ku, Toyko, both of Japan

[22] Filed: Sept. 14, 1967

[21] Appl. No.: 667,656

[30] Foreign Application Priority Data

Sept. 27, 1966 Japan ..................41/63381
Sept. 28, 1966 Japan ..................41/63428

[52] U.S. Cl. ..................96/115
[51] Int. Cl. ..................G03c 1/68
[58] Field of Search ..................96/115, 115 P, 91, 93; 204/159.23, 159.15; 260/76, 861

[56] References Cited

UNITED STATES PATENTS

| | | | |
|---|---|---|---|
| 3,066,117 | 11/1962 | Rinke et al. | 260/77.5 |
| 3,231,381 | 1/1966 | Dickinson et al. | 96/75 |
| 2,980,535 | 4/1961 | Schroeter | 96/35 |
| 2,956,878 | 10/1960 | Michiels et al. | 96/33 |
| 2,949,361 | 8/1960 | Agens | 96/115 |
| 3,483,169 | 12/1969 | Case et al. | 260/861 |
| 3,196,131 | 7/1965 | Mayer et al. | 260/861 |
| 2,855,373 | 10/1958 | Guenther | 260/861 |

*Primary Examiner*—Norman G. Torchin
*Assistant Examiner*—Edward C. Kimlin
*Attorney*—Burgess, Dinklage & Sprung

[57] ABSTRACT

The photosensitive compositions comprising (a) an unsaturated polyester (b) at least one addition polymerizable ethyenically unsaturated monomer having at least one $CH_2=C<$ group and having a boiling point above 100° C at normal atmospheric pressure and (c) a photopolymerization initiator, said unsaturated polyester comprising the segment (I) of the formula:

$$-\left(R_1-O\right)_x-$$

(wherein $R_1$ is alkylene group having 2 to 4 carbon atoms; and $x$ is 2 to 100) the segment (II) of the formula $$-\left[\left(CH_2\right)_y-O-\overset{O}{\overset{\|}{C}}-R_2-\overset{O}{\overset{\|}{C}}-O\right]_z\left(CH_2\right)_y-$$

(wherein $R_2$ is

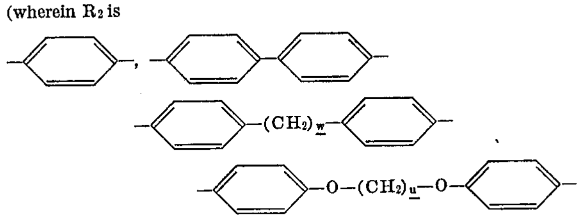

or naphthylene; $y$ is 2 to 4; $z$ is 1 to 10; $w$ and $u$ are respectively 1 to 4) and the segment (III) corresponding to the residue of an unsaturated dicarboxylic acid. These photosensitive compositions are soluble in water or aqueous solvent such as an aqueous alkali solution and are non-tacky solids at a temperature of 20° C.

8 Claims, No Drawings

PHOTOSENSITIVE COMPOSITIONS

The present invention relates to novel photosensitive compositions which are readily capable of forming three-dimensional high polymers by photocrosslinking.

Such photosensitive compositions are useful for manufacturing printing plates for letterpress, dry offset, flexographic or screenprinting, or reliefs for display or indication applications or name plates. These plates or reliefs are easily produced by exposing a layer of the photosensitive compositions to actinic light through an image-bearing transparency, e.g., a negative or a positive and then washing out of the unexposed areas with a solvent.

The photosensitive compositions for above-described applications are firstly to be nontacky solids at a temperature of 20° C., secondly to be soluble in water or an aqueous solvent, for example, an aqueous alkali solution and thirdly to have a high chemical resistance and a sufficient strength in the exposed areas.

Viscous photosensitive compositions are not only difficult to handle and also spoil image-bearing transparencies, but the image-bearing transparencies are solidly adhered to the photosensitive compositions by photocrosslinking. For preventing such adhesion, a transparent protective film such as Cellophane or polyethylene, which are easily removed after photocrosslinking, must be placed on the surface of the layer of the photosensitive compositions. Liquid photosensitive compositions require a support and a frame of a uniform thickness for keeping the layer of the photosensitive composition both even and in a uniform shape during the exposure. It is also very difficult to expose the spherical layer of the liquid photosensitive compositions to actinic light. These are all disadvantageous for practical purposes. When organic solvents are utilized for development, due to insolubility of the photosensitive compositions in water or aqueous solvents, it is necessary to install ventilation facilities and recovery devices because of the potential danger from flames and injury to workers' health. When the exposed area of the photosensitive compositions have a poor chemistry resistance, they are deformed by ink or paint containing such organic solvents and are impossible to be used.

Heretofore, photosensitive compositions comprising a photosensitizer, an addition polymerizable polyfunctional monomer having at least two $$CH_2{=}C\lt$$

groups and a water-soluble polymer such as cellulose derivatives and polyvinylalcohols have been known (U.S. Pat. Nos. 2,927,022, 2,902,365 and 3,036,914).

Said water-soluble polymers in the photosensitive compositions act to keep the photosensitive compositions solid at room temperature and make them soluble in an aqueous alkali solution at the same time, but do not take part in the reaction under the influence of actinic light. These water-soluble polymers are inert photochemically and are only intertwined into the three-dimensional network structure formed by the photopolymerization of an addition polymerizable polyfunctional monomer. Consequently, after exposure to actinic light such photosensitive compositions as above cited are poor in flexibility, easily collapsed by a mechanical impact, rapidly swell after immersion in many organic solvents, and are very poor in chemical resistance.

Furthermore, it is known that photosensitive compositions comprising an unsaturated polymer having the olefinic double bond in the main chain, an addition polymerizable monomer and a photosensitizer are photocrosslinked under the influence of actinic light (Industrial and Engineering Chemistry Vol. 31, No. 12, p. 1,512 and Vol. 47, No. 10, p. 2,125; U.S. Pat. No. 2,673,151).

However, these photosensitive compositions are all liquid and not suitable for practical purposes. Above all, these compositions are hardly soluble in any aqueous solvent, for example, a 0.5 percent aqueous sodium hydroxide solution, and require organic solvents for development.

The present invention is to provide novel and useful photosensitive compositions which avoid the prior art disadvantages.

One object of this invention is to provide such photosensitive compositions that are nontacky solid at a temperature of 20° C. and are soluble in water or aqueous solvents, especially an aqueous alkali solution at the same time before photocrosslinking.

Another object of this invention is to provide such photosensitive compositions that are easily and readily photocrosslinked under the influence of actinic light to produce crosslinked polymers having superior flexibility and superior chemical resistance.

According to this invention there have been provided novel photosensitive compositions comprising (*a*) an unsaturated polyester, (*b*) at least one addition polymerizable ethylenically unsaturated monomer containing at least one $$CH_2{=}C\lt$$

group and having a boiling point above 100° C. at normal atmospheric pressure and (*c*) photopolymerization initiator, said unsaturated polyester comprising the segment (I) of the formula:

$$-\left(R_1-O\right)_x-$$

(wherein $R_1$ represents alkylene group having two to four carbon atoms; $x$ is 2 to 100), the segment (II) of the formula:

$$\left[\left(CH_2\right)_y-O-\overset{O}{\overset{\|}{C}}-R_2-\overset{O}{\overset{\|}{C}}-O\right]_z\left(CH_2\right)_y$$

(wherein $R_2$ represents a member selected from the group consisting of

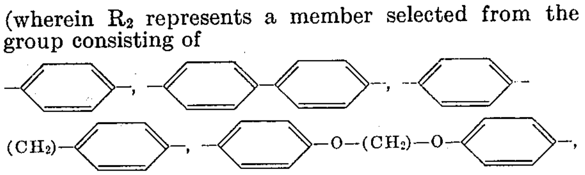

and naphthylene group; $y$ is 2 to 4; $z$ is 1 to 10; $w$ is 1 to 4, and $u$ is 1 to 4) and the segment (III) corresponding to the residue of an unsaturated dicarboxylic acid.

It is believed that in the unsaturated polyesters, i.e., the first component of this invention, the ether-oxygen groups in the segment (I) give a desirable flexibility to the unsaturated polyester molecules and also give solubility in water or aqueous solvents, for example, an aqueous sodium hydroxide solution. On the other hand the segment (II) gives a high melting point to the unsaturated polyesters and the segment (III) takes part in the photocrosslinking reaction of the unsaturated polyester molecules.

Such unsaturated polyesters do not melt or flow generally below about 80° C. and the photosensitive compositions comprising such an unsaturated polyester, an addition polymerizable ethylenically unsaturated monomer and a photosensitizer are nontacky solids at a temperature of 20° C.

An unsaturated polyester, i.e., the first component of the present invention is produced by the conventional condensation reaction of an "etherdiol" corresponding to the above-described segment (I) and having the formula:

$$HO-(R_1-O)_x-H$$

(wherein $R_1$ represents alkylene group having two to four carbon atoms; $x$ is 2 to 100) with an "esterdiol" corresponding to the above-described segment (II) and having the formula;

$$HO-\left[(CH_2)_y-O-\overset{O}{\overset{\|}{C}}-R_2-\overset{O}{\overset{\|}{C}}-O-\right]_z(CH_2)_y-OH$$

(wherein $R_2$ represents a member selected from the group consisting of

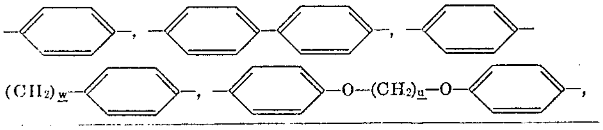

naphthylene group; $y$ is 2 to 4, $z$ represents 1 to 10; $w$ and $u$ are respectively 1 to 4) and an unsaturated dicarboxylic acid or the derivative thereof.

The etherdiols utilized for the preparation of an unsaturated polyester, i.e., the first component of this invention, are preferably polyethyleneglycols having 2 to 100 of $-CH_2-CH_2O-$ groups in the main chain, polypropyleneglycols having 2 to 100 of $-CH_2CH(CH_3)O-$ groups or $-CH_2CH_2CH_2O-$ groups in the main chain, polybutyleneglycols having 2 to 50 of $-CH_2CH_2CH_2CH_2O-$ groups in the main chain and copoly(oxyethylene-oxypropylene)glycols having 2 to 50 of $-CH_2CH_2O-$ groups; and $-CH_2CH(CH_3)O-$ group respectively in the main chain.

The esterdiols utilized for the preparation of the first component may be easily and readily produced by the condensation reaction of a polymethyleneglycol having the formula:

$$HO-(CH_2)_y-OH$$

(wherein $y$ is 2 to 4) with am aromatic dicarboxylic acid or the methyl or ethylester thereof having a formula;

$$R_3-O-\overset{O}{\overset{\|}{C}}-R_2-\overset{O}{\overset{\|}{C}}-O-R_3$$

(wherein $R_2$ represents a member selected from the group consisting of

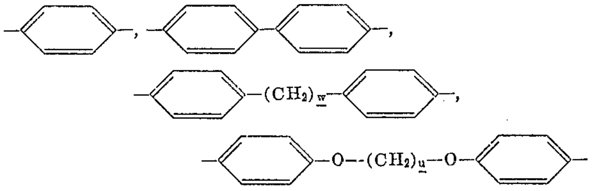

naphthylene group; $R_3$ represents a member selected from the group consisting of hydrogen atom, methyl and ethyl group; $w$ and $u$ are respectively 1 to 4).

Such esterdiols are produced by (A) reacting the above-described polymethyleneglycol with, for example, the above-described aromatic dicarboxylic acid dimethylester in an inert gas atmosphere at a temperature between 150° and 300° C. in such amounts as to provide an esterdiol having a desired degree of polymerization or a desired molecular weight with the produced methanol being distilled off according to the following equation;

$$(Z+1)\cdot HO-(CH_2)_y-OH + Z\cdot H_3C-O-\overset{O}{\overset{\|}{C}}-R_2-\overset{O}{\overset{\|}{C}}-O-CH_3 \longrightarrow HO[(CH_2)_y-O-\overset{O}{\overset{\|}{C}}-R_2-\overset{O}{\overset{\|}{C}}-O]_z-(CH_2)_y-OH + 2Z\cdot CH_3OH$$

or by (B) adding $a$ or more times moles of a polymethyleneglycol to, for example, an aromatic dicarboxylic acid dimethylester in an inert gas atmosphere at a temperature between 150° and 200° C. with the produced methanol being distilled off and raising the temperature of the resulting reaction mixture to between 200° and 300° C. and, if necessary, with the produced polymethyleneglycol being distilled off under reduced pressure to provide an esterdiol having a desired degree of polymerization or a desired molecular weight according to the following equations (I) and (II);

(I)

$$2Z\cdot HO-(CH_2)_y-OH + Z\cdot H_3C-O-\overset{O}{\overset{\|}{C}}-R_2-\overset{O}{\overset{\|}{C}}-O-CH_3 \longrightarrow Z\cdot HO-(CH_2)_y-O-\overset{O}{\overset{\|}{C}}-R_2-\overset{O}{\overset{\|}{C}}-O-(CH_2)_y-OH + 2Z\cdot CH_3OH$$

(II)

$$Z\cdot HO-(CH_2)_y-O-\overset{O}{\overset{\|}{C}}-R_2-\overset{O}{\overset{\|}{C}}-O-(CH_2)_y-OH \longrightarrow HO-\left[(CH_2)_y-O-\overset{O}{\overset{\|}{C}}-R_2-\overset{O}{\overset{\|}{C}}-O-\right]_z(CH_2)_y-OH + (Z-1)\cdot HO-(CH_2)_y-OH$$

The polymethyleneglycols utilized for the preparation of above-described esterdiols include, for example, ethyleneglycol, 1,3-propanediol and 1,4-butanediol. According to this invention the polymethyleneglycol preferably contains two to four carbon atoms in the methylene group. It has been found that when the methylene group contains more than four carbon atoms the melting points of the resulting esterdiols become lower and, accordingly the photosensitive compositions containing the unsaturated polyesters prepared from such esterdiols are not always nontacky at room temperature.

Exemplary aromatic dicarboxylic acids or methyl or ethylesters thereof utilized for the preparation of above-described esterdiols include terephthalic acid, p,p'-biphenyldicarboxylic acid, bis-(p-carboxyphenyl)-methane, 1,2-bis-(p-carboxyphenyl)-ethane, 1,3-bis-(p-carboxyphenyl)-propane, 1,4-bis-(p-carboxyphenyl)-butane, 1,2-bis-(p-carboxyphenoxy)-ethane, 1,3-bis-(p-carboxyphenoxy)-propane, 1,4-bis-(p-carboxyphenoxy)-butane, 1,5-naphthalene-dicarboxylic acid, 2,6-naphthalene-dicarboxylic acid, 2,7-naphthalene-dicarboxylic acid and dimethyl and diethylesters thereof.

Exemplary unsaturated dicarboxylic acids and derivatives thereof utilized for the preparation of the first component, i.e., an unsaturated polyester include maleic acid, fumaric acid, citraconic acid, methaconic acid, itaconic acid, glutaconic acid, muconic acid, aconitic acid, lower alcohol esters thereof, for examples, dimethyl and diethylesters thereof, maleic anhydride, citraconic anhydride.

In order to improve abrasion resistance and tensile strength of the photosensitive compositions after photocrosslinking, a part of the segment (I) in the unsaturated polyester, i.e., the first component, may be substituted with a glycol not having the ether-oxygen group. For this purpose, less than 90 mole percent of an etherdiol corresponding to the segment (I) may be substituted with a glycol such as ethyleneglycol, 1,2-propanediol, 1,3-propanediol and 1,4-butanediol. When the amount of such glycols is more than 90 mole percent, the solubility of the photosensitive compositions in an aqueous solution disadvantageously lowers.

In order to change hardness or flexibility of the photosensitive compositions after photocrosslinking by varying the double-bond equivalent (the molecular weight per one double bond) in an unsaturated polyester, i.e., the first component, a part of the segment (III) corresponding to an unsaturated dicarboxylic acid or the derivative thereof may be substituted with a saturated dicarboxylic acid or the derivative thereof. When the amount of such saturated dicarboxylic acid or the derivative thereof is more than 90 mole percent of an unsaturated dicarboxylic acid or the derivative thereof, the chemical resistance and the tensile strength of the photosensitive compositions after photocrosslinking unfavorably lower.

Such saturated dicarboxylic acids and the derivatives thereof include, for example, oxalic acid, malonic acid, methylmalonic acid, succinic acid, methylsuccinic acid, glutaric acid, sebacic acid, phthalic acid, isophthalic acid, terephthalic acid and the lower alcohol esters thereof such as dimethylesters and diethylester. It is preferred that the segment (II) in an unsaturated polyester, i.e., the first component, is present in amounts of at least 10 mole percent of the total amount of the segment (I) and the segment (II) so that the photosensitive composition according to this invention may be a nontacky solid at a temperature of 20° C. When said segment (II) is present in amounts of less than 10 mole percent, the photosensitive compositions are not always nontacky solid at a temperature of 20° C. On the other hand it is preferred that said segment II is present in amounts of at most 90 mole percent of the total amount of the segment (I) and segment (II) so that said unsaturated polyester may be soluble in an aqueous solvent, for example, a 0.5 percent aqueous sodium hydroxide solution. Accordingly it is preferred that the amount of the segment (II) in said unsaturated polyester can be varied from 10 to 90 mole percent based on the total amount of the segment (II) and the segment (I) so that the photosensitive composition containing said unsaturated polyesters as the first component may be a nontacky solid and soluble in an aqueous solvent at a temperature of 20° C.

The unsaturated polyesters containing said segments (I), (II) and (III) of this invention are produced by reacting said etherdiol and said esterdiol with said unsaturated dicarboxylic acid or the derivative thereof, if necessary, with the addition of said glycol not having the ether-oxygen group or the derivative thereof thereto, in an inert atmosphere at a temperature of between 150° and 300° C. Thus produced unsaturated polyesters melt to flow only above about 80° C.

As the second component of the present composition, the addition polymerizable ethylenically unsaturated monomer preferably contains at least one $$CH_2=C\langle$$

group and has a boiling point above 100° C. at normal atmospheric pressure in view of reactivity and easy handling.

Exemplary the addition polymerizable, ethylenically unsaturated monomers include acrylamides such as acrylamide, methacrylamide, N-hydroxymethylacrylamide, N-hydroxymethylmethacrylamide, N-methaoxymethylacrylamide, N-methoxymethylmethacrylamide, N-ethoxymethylacrylamide, N-ethoxymethylmethacrylamide, N-butoxymethylacrylamide, N-butoxymethylmethacrylamide, N,N'-methylene bisacrylamide, N,N'-methylenebismethacrylamide, N,N'-hexamethylene bisacrylamide, N,N'-hexamethylenebismethacrylamide, acrylic acid and acrylates such as propylacrylate, butyl acrylate, 2-hydroxyethyl acrylate, 2,-hydroxypropyl acrylate, ethyleneglycol diacrylate, propyleneglycol diacrylate, diethyleneglycol diacrylate, triethyleneglycol diacrylate, polyethyleneglycol diacrylate (an average molecular weight of the polyethyleneglycol being below about 2,000), polypropyleneglycol diacrylate (an average molecular weight of the polypropyleneglycol being below about 2,000), 1,4-butyleneglycol diacrylate, glycerin triacrylate, trimethylol propane triacrylate, allyl acrylate, glycidyl acrylate, cyclohexyl acrylate, tetrahydrofurfuryl acrylate, methacrylic acid or methacrylates such as propyl methacrylate, butyl methacrylate, 2-hydroxyethyl methacrylate, 2-hydroxypropyl methacrylate, ethyleneglycol dimethacrylate, propyleneglycol dimethacrylate, diethyleneglycol dimethacrylate, triethyleneglycol dimethacrylate, polyethyleneglycol dimethacrylate (an average molecular weight of the polyethylene glycol being below about 2,000), polypropylene glycol dimethacrylate (an average molecular weight of the polypropyleneglycol being below about 2,000), 1,4-butyleneglycol dimethacrylate, glycerin trimethacrylate, trimethylolpropane trimethacrylate, allylmethacrylate, glycidyl methacrylate, cyclohexyl methacrylate, tetrahydrofurfuryl methacrylate; α-substituted acrylic acid such as α-chloroacrylic acid, αbromoacrylic acid, styrene and derivatives thereof such as p-vinylphenol, p-vinylbenzoic acid, divinylbenzene, vinyl esters such as vinylstearate, vinyl benzoate, allylesters such as allylmethacrylate, diallyl phthalate; N-vinyl phthalmide and N-vinyl succinimide.

It is preferred to employ such additional polymerizable ethylenically unsaturated monomer in amounts of from 5 to 150 parts by weight based upon 100 parts of the unsaturated polyester. When the amount of said unsaturated monomer is less than 5 parts by weight, the rate of the photocrosslinking reaction is very slow and a mechanical strength after photocrosslinking is small for the practical use. When said amount is more than 150 parts by weight, flexibility after photocrosslinking is impaired and a chemical resistance is lowered.

It is confirmed that aforesaid unsaturated polyester can be photocrosslinked with aforesaid unsaturated monomer with the use of a known photopolymerization initiator as photopolymerization initiator.

Examples of suitable such photopolymerization initiators include benzoins such as benzoin, benzoin methylether, benzoin ethylether, α-methylbenzoin, α-phenylbenzoin, αallylbenzoin; diketones such as benzil, diacetyl; disulfide such as diphenyl disulfide; uranyl salts such as uranyl nitrate, uranyl propionate; 2-naphthalene sulfonyl chloride; anthraquinones such as anthraquinone; chloroanthraquinone, methylanthraquinone, tert-butylanthraquinone; carbonium dyes such as Eosine G (C.I. 45380), Fluorescein (C.I. 45350), Erythosine (C.I. 45430), Rhodamine B (C.I. 45170), Malachite Green (C.I. 42000); thiazine dyes such as Methylene Blue (C.I. 52015), Thionine (C.I. 52025); azine dyes such as Neutral Red PG (C.I. 22245) ; acridine dyes such as Acriflavine (C.I. 46000), Acridine Orange NS (C.I. 46005); and anthraquinone vat dyes such as Indanthrene (C.I.69800).

These photopolymerization initiators are preferably used in proportion of 0.0001 to 10 parts by weight based upon 100 parts by weight of a unsaturated polyester. When the amount of the photopolymerization initiator is less than 0.0001 parts by weight, the photocrosslinking reaction is retarded and is disadvantageous from the practical point. On the other hand when said amount is more than 10 parts by weight, the photopolymerization initiation is not fully intensified for its amount and the mechanical strength after photocrosslinking is disadvantageously reduced.

Known thermal polymerization inhibitors may be employed for the purpose of maintaining a storage stability of the photosensitive compositions. Such thermal polymerization inhibitors may be added when the components of a composition are admixed or may be preliminarily added to each component prior to admixing the components.

Exemplary thermal polymerization inhibitors include hydroquinone, mono-tert-butylcatechol, p-methoxyphenol, catechol, p-tert-butylcatechol, 2,5di-tert-butylhydroquinone, benzoquinone, 2,5-diphenyl-p-benzoquinone, picric acid, di-p-fluorophenylamine, cuprous chloride and ferrous chloride. These inhibitors are added only for preventing the thermal polymerization reaction (i.e., dark reaction) without restraining the photocrosslinking reaction. Consequently the amount of the inhibitors may be varied from 0.005 to 2.0 parts by weight based on 100 parts by weight of the total amount of the first component of an unsaturated polyester and the second component of an addition polymerizable ethylenically unsaturated monomer.

Known inert fillers may be added to a photosensitive composition of this invention for reinforcing the photosensitive composition after photocrosslinking.

The inert fillers are preferably present in such amounts as not to spoil the transparency of a photosensitive composition. When said amount is too much, the photosensitivity is reduced due to the inferior transparency of the photosensitive composition. Such inert fillers include glass, mica, potter's clay, silica, asbestos, magnesium silicate, magnesium carbonate, aluminum, cellulose, polyhexamethyleneadipamide and polyethyleneterephthalate in powder form.

THe photosensitive compositions according to the present invention is prepared by admixing the above-described components by a mixer such as a kneader, a pair of rolls and a Banbury mixer.

The present photosensitive compositions are nontacky solids at a temperature of 20° C. and soluble in water or an aqueous solution of alkali such as sodium hydroxide, potassium hydroxide and ammonia as well as soluble in an organic solvent such as chloroform, tetrahydrofuran, 1,2-dichloroethane, 1,1,1-trichloroethane, trichloroethylene, pyridine and dioxane.

The photosensitive compositions of the present invention can be deposited, as a photosensitive layer, on the surface of a support by means of conventional pressing, extrusion or calendering apparatus.

A thickness of photosensitive layer formed on the support can be changed optionally, and usually a photosensitive layer in 0.1 mm. to 10 mm. thickness is satisfactorily used as a layer of a photosensitive element for printing plates.

The present photosensitive compositions are readily photocrosslinked by light having wave lengths below 7,000 Angstroms, generally between 2,000 and 5,000 Angstroms, namely, actinic light. Practical sources of such actinic light include carbon arc lamps, super high-pressure mercury lamps, high-pressure mercury lamps and low-pressure mercury lamps and chemical lamps such as fluorescent lamps.

When the photosensitive compositions are exposed to the light from a carbon arc lamp through an image-bearing transparency, e.g., a photographic negative film, the image area of the composition is substantially cross-linked in about 1 to 30 minutes. The negative film after exposure is neither stained nor damaged. After removal of the negative film, the nonimage area of the composition is washed out with a 0.5 percent aqueous sodium hydroxide solution and there is formed a relief corresponding to the image area upon a support.

The resulting relief images are useful for manufacturing various printing plates, reliefs for display or indication applications and name plates. Especially they can give more than 500,000 prints when utilized as printing plates. These reliefs exhibit a superior flexibility, strength and chemical resistance.

This invention will be illustrated by the following examples which are in no way limiting upon the scope hereof.

EXAMPLE 1

Preparation of Esterdiol

To 582 g. of dimethylterephthalate and 400 g. of ethyleneglycol, there was added 5.5 g. of zinc acetate and the obtained mixture was heated at a temperature of between 180° and 190° C. in nitrogen atmosphere until 192 g. of methanol was distilled off from the reaction mixture. Then while keeping the temperature between 230° and 250° C. 152 g. of ethyleneglycol was distilled off from the resulting reaction mixture to produce an esterdiol having an average degree of polymerization 3 and an average molecular weight of about 640.

Preparation of Unsaturated Polyester

While keeping the temperature of thus produced esterdiol between 220° and 230° C. 58 g. of fumaric acid, 238 g. of adipic acid and 5 g. of p-toluenesulfonic acid were added thereto and after 30 minutes 300 g. of polyethylene glycol having a molecular weight of 600 was further added to the resulting reaction mixture. The reaction was continued for 8 hours distilling off the produced water to prepare an unsaturated polyester having an acid value of 19.

Preparation of Photosensitive Composition

To 100 g. of thus obtained unsaturated polyester, there were added 15 g. of acrylamide, 20 g. of N-methyloacrylamide, 2 g. of benzoin and 0.1 g. of hydroquinone and the resultant mixture was mingled sufficiently by a pair of rolls heated at 60° C. and then formed into a sheet 1 mm. thick by pressing under a pressure of 150 kg./cm.². Thus obtained photosensitive composition was nontacky solid below 40° C. and was dispersed and dissolved in a 0.5 percent aqueous sodium hydroxide solution.

Preparation of Relief

One surface of the resulting sheet was exposed to the light from a 3 kw. carbon arc lamp for 5 minutes and then a negative film bearing a transparent image of lines was placed on the other surface of the sheet and exposed to the light from aforesaid carbon arc lamp for 20 minutes. After washout of the unexposed areas with a 0.5 percent aqueous sodium hydroxide solution, a relief corresponding to the transparent areas of the negative film was obtained. This relief was immersed in benzene, xylene, methylethyl ketone and methanol for 24 hours respectively and the degree of weight increase was found below 1 percent and the relief exhibited an excellent chemical resistance.

Printing

The resulting sheet bearing the relief was fixed around a cylinder of a flexographic printing machine and kraft paper, Cellophane, polyvinylchloride film, polyethylene film and polypropylene film were printed with the photogravure printing ink which contained butylacetate and xylene as solvent. Any deformation of the relief image was not observed through 500,000 prints.

EXAMPLE 2

In nitrogen atmosphere a mixture of 485 g. of dimethylterephthalate, 270 g. of 1,4-butanediol and 5 g. of zinc acetate was heated at a temperature of between 180° and 190° C. until about 160 g. of methanol was distilled off and then the reaction mixture was brought to a temperature between 220° and 230° C. and held there for another 1 hour. To the obtained esterdiol having an average polymerization degree of about 5, there were added 29 g. of maleic acid. 88.5 g. of succinic acid, 3 g. of p-toluenesulfonic acid and 600 g. of polypropyleneglycol having an average molecular weight of 1,200 and the reaction was continued for 10 hours to produce an unsaturated polyester having an acid value of 23.

In the same manner as in Example 1, a photosensitive composition was prepared utilizing the resulting unsaturated polyester.

The obtained photosensitive composition was nontacky below 40° C. and dissolved in a 0.5 percent aqueous sodium hydroxide solution. A sheet of the photosensitive composition obtained in the same manner as in Example 1 was exposed to the light from a 3 kw. carbon arc lamp for 20 minutes and the sheet was quite capable of a 180° flexing and the photocrosslinked sheet exhibited the same chemical resistance as the one in Example 1.

EXAMPLE 3

Preparation of Esterdiol

To 270 g. of p,p'-biphenyldicarboxylic acid dimethylester and 130 g. of ethyleneglycol, there was added 3 g. of zinc acetate and the obtained mixture was heated at a temperature between 180° and 200° C. in nitrogen atmosphere distilling off 64 g. of methanol.

Then the temperature was raised to between 230° and 250° C. and 37 g. of ethyleneglycol was distilled off to produce an esterdiol having an average molecular weight of about 600.

Preparation of Unsaturated Polyester

While keeping the temperature of thus obtained esterdiol between 230° and 250° C., there were added 29 g. of fumaric acid, 109.5 g. of adipic acid and 3 g. of p-toluenesulfonic acid thereto and after 30 minutes, 300 g. of polyethyleneglycol having an average molecular weight of 600 was further added to the resulting reaction mixture. The reaction was continued for 8 hours until the resulting water was distilled off to produce an unsaturated polyester having an acid value of 20.

Preparation of Photosensitive Composition

To 100 g. of thus obtained unsaturated polyester, there were added 15 g. of acrylamide, 20 g. of N-methyloacrylamide, 2 of benzoin and 0.1 g. of hydroquinone and the resulting mixture was mingled sufficiently by a pair of rolls heated at about 80° C. and then formed into a sheet 1 mm. thick by pressing under a pressure of 150 kg./cm.². Thus obtained photosensitive composition was nontacky solid below 60° C. and dissolved in a 0.5 percent aqueous sodium hydroxide solution.

Preparation of Relief

One surface of the obtained sheet was exposed to the light from a 3 kw. carbon arc lamp for 5 minutes and then a negative film bearing a transparent image of lines was placed on the other surface of the sheet and exposed to the light from aforesaid carbon arc lamp for 20 minutes.

After washout of the unexposed areas with a 0.5 percent aqueous sodium hydroxide solution, a relief corresponding to the transparent areas of the negative film. This relief was immersed in benzene, xylene, methyl ethylketone and methanol and the degree of weight increase was found below 1 percent.

Printing obtained The relief was fixed around a cylinder of a flexographic printing machine and kraft paper, Cellophane, polyvinylchloride film, polyethylene film and polypropylene film were printed with the photogravure printing ink which contained butylacetate and xylene as solvent. Any deformation of the relief image was not observed through about 500,000 prints.

EXAMPLE 4

To 284 g. of bis-(p-carboxyphenyl)-methane dimethylester and 130 g. of ethyleneglycol, there was added 3 g. of zinc acetate and the obtained mixture was heated at a temperature of between 180° and 240° C. in nitrogen atmosphere distilling off 64 g. of methanol and 37 g. of ethyleneglycol to produce an esterdiol having an average molecular weight of about 626. Utilizing about 313 g. of the obtained esterdiol in the same manner as in Example 3, there was obtained an unsaturated polyester having an acid value of 24 and then utilizing 100 g. of the resulting unsaturated polyester, 2 g. of benzoin methylether and 0.3 g. of benzophenone, a photosensitive composition was prepared and formed into a sheet 1 mm. thick. Thus obtained photosensitive composition was nontacky solid below 60° C. and dispersed and dissolved in a 0.5 percent aqueous sodium hydroxide solution.

A relief was prepared from the resulting sheet in the same manner as in Example 3 and exhibited the same chemical resistance and printing resistance as the one in Example 3.

EXAMPLE 5

To 330 g. of 1,2-bis-(p-carboxyphenoxy)-ethane dimethylester and 130 g. of ethyleneglycol, there was added 3 g. of zinc acetate and the obtained mixture was heated at a temperature of between 180° and 240° C. distilling off 64 g. of methanol and 37 g. of ethyleneglycol to produce an esterdiol having an average molecular weight of about 718. Utilizing about 359 g. of the obtained esterdiol there was obtained an unsaturated polyester having an acid value of about 25 and then utilizing 100 g. of the resulting unsaturated polyester, 0.1 g. of Thionine (C.I. 52025) and 15 g. of silica, a photosensitive composition was prepared and formed into a sheet 1 mm. thick in the same manner as in Example 3. Thus obtained photosensitive composition was nontacky below 60° C. and dispersed and dissolved in a 0.5 percent aqueous sodium hydroxide solution. A relief was prepared from the resulting sheet in the same manner as in Example 3 and exhibited the same chemical resistance and printing resistance as the one in Example 3.

Example 6

To 366 g. of 2,6-naphthalenedicarboxylic acid dimethylester and 150 g. of ethyleneglycol there was obtained 3 g. of zinc acetate and the obtained mixture was heated at a temperature of between 180° and 240° C. in nitrogen atmosphere distilling off 96 g. of methanol and 26 g. of ethyleneglycol to produce an esterdiol having an average molecular weight of about 788. Utilizing about 394 g. of the obtained esterdiol in the same manner as in Example 3 there was obtained an unsaturated polyester having an acid value of 23 and then utilizing 100 g. of the resulting unsaturated polyester in the same manner as in Example 3, a photosensitive composition was prepared and formed into a sheet 1 mm. thick. Thus obtained photosensitive composition was nontacky below 60° C. and dispersed and dissolved in a 0.5 percent aqueous sodium hydroxide solution. A relief was prepared from the resulting photosensitive composition in the same manner as in Example 3 and exhibited the same chemical resistance and printing resistance as the one in Example 3.

EXAMPLE 7

A mixture of 540 g. of p,p'biphenyldicarboxylic acid dimethylester, 225 g. of 1,4-butadiol and 4 g. of zinc acetate was heated at a temperature of between 170° and 190° C. in nitrogen atmosphere distilling off about 127 g. of methanol and then the reaction mixture was brought to a temperature of between 230° and 250° C. and held there for 2 hours to produce an esterdiol having an average molecular weight of about 1,274. About 637 g. of the obtained esterdiol was brought to a temperature of 200° and 220° C. and there were added thereto 29 g. of maleic acid 88.5 g. of succinic acid and 3 g. of p-toluenesulfonic acid and 1 hour later 90 g. of polypropyleneglycol having an average molecular weight of 300 and 400 g. of polyethyleneglycol having an average molecular weight of 1,000 were added thereto and the reaction was continued for about 9 hours to give an unsaturated polyester having an acid value of 24. To 100 g. of the resulting polyester there were added 10 g. of acrylamide, 15 g. of N,N'-methylenebisacrylamide, 3 g. of diallylphthalate, 2 g. of benzoin and 0.1 g. p-methoxyphenol and in the same manner as in Example 1 a sheet 1 mm. thick of the resulting photosensitive composition was prepared. This photosensitive composition was nontacky solid below 50° C. and dispersed and dissolved in 0.5 percent aqueous sodium hydroxide solution. A relief was prepared from the resulting sheet in the same manner as in Example 1 and exhibited the same chemical resistance and printing resistance as the one in Example 1.

Examples 8 TO 14

A variety of esterdiols shown in Table I were prepared from dimethylterephthalate and a desired polymethyleneglycol in the same manner as in Example 2 and then utilizing the esterdiols, a desired diol and a desired dicarboxylic acid, a variety of unsaturated polyesters shown in Table II were prepared in the same manner as in Example 1. From each resulting unsaturated polyesters, a sheet of photosensitive composition was prepared in the same manner as in Example 1. Each photosensitive composition was nontacky solid below 40° C. and dispersed and dissolved in a 0.5 percent aqueous sodium hydroxide solution. The resulting sheet was exposed to the light from a 300w. high-pressure mercury lamp to harden in 10 to 20 minutes and was quite capable of a 180° flexing and exhibited the same chemical resistance as the one in Example 1.

TABLE I

| Esterdiol | Polymethylene-glycol | PMG/DMT* (mole ratio) | Average Molecular Weight |
|---|---|---|---|
| a | ethyleneglycol | 1.5/1.0 | 446 |
| b | ethyleneglycol | 1.2/1.0 | 1022 |
| c | 1,3-propanediol | 1.1/1.0 | 2136 |
| d | 1,3-propanediol | 1.2/1.0 | 1106 |
| e | 1,4-butanediol | 1.2/1.0 | 1190 |

*PMG/DMT means the mole ratio of polymethyleneglycol to dimethylterephthalate

Table II

| Example | Composition (Mole ratio) |
|---|---|
| 8 | a/PEG 600/1,4-BG/MA/IA/SE (0.55/0.35/0.1/0.2/0.1/0.7) |
| 9 | a/PEG 1000/DEG/MA/GL/IPA (0.5/0.3/0.2/0.2/0.1/0.7) |
| 10 | b/PEG 200/PPG 400/EG/FA/AD (0.4/0.15/0.25/0.2/0.2/0.8) |
| 11 | b/PEPG 1000/PBG 800/FA/SU (0.5/0.4/0.1/0.25/0.75) |
| 12 | c/PEG 4000/PEG 600/EG/FA/MU/ML (0.3/0.05/0.55/0.1/0.6/0.2/0.2) |
| 13 | d/PEG 1540/PPG 400/MAA/AC/PAA (0.5/0.2/0.3/0.3/0.1/0.6) |
| 14 | e/PEPG 2000/1,2-PG/MA/CI/MS (0.6/0.3/0.1/0.2/0.2/0.6) |

Note: a, b, c and d represent the corresponding esterdiol in Table I respectively. PEG 600, 1000, 1540, 2000 and 4000 (=polyethyleneglycol having an average molecular weight of 600, 100, 1540, 2000 and 4000 respectively), PEPG 1000 and 2000 [=copoly (oxyethyleneoxypropylene) glycol having an average molecular weight of 1000 and 2000 respectively], PPG 400 ( polypropyleneglycol having an average molecular weight of 400), PBG 800 (=polybutyleneglycol having an average molecular weight of 800), EG (=ethyleneglycol), DEG (=diethyleneglycol), 1,2-PG (=1,2-propanediol), 1,4-BG (=1,4-butanediol), MA (=maleic acid), FA (=fumaric acid), MAA (=maleic anhydride), CI (=citraconic acid), IA (=itaconic acid), GL (=glytaconic acid), MU (=muconic acid), AC (=actonitic acid), SU (=succinic acid), MS (=methylsuccinic acid), ML (=malonic acid), SE (=sebacic acid), IPA (=isophthalic acid), PAA (=phthalic anhydride).

EXAMPLES 15 TO 27

A variety of esterdiols shown in Table III were prepared from a desired aromatic dicarboxylic acid dimethylester and a desired polymethyleneglycol in the same manner as in Example 7 and then utilizing the esters, a desired diol and a desired dicarboxylic acid, a variety of unsaturated polyesters shown in Table IV were prepared in the same manner as in Example 3. From the resulting unsaturated polyesters, a sheet 1 mm. thick of a photosensitive composition was prepared in the same manner as in Example 7. Each photosensitive composition was nontacky solid below 40° C. and dissolved in a 0.5 percent aqueous sodium hydroxide solution. The resulting sheet was exposed to the light from a 300 w. high-pressure mercury lamp to substantially harden in 10 to 30 minutes and was quite capable of a 180° flexing and exhibited the same chemical resistance as the one in Example 1.

TABLE III

| Esterdiol | Aromatic dicarboxylic acid (X) | Polymethyleneglycol (Y) | Ratio X/Y | Average molecular weight |
|---|---|---|---|---|
| a | A | EG | 1.5/2.0 | 866 |
| b | A | PG | 1.0/1.1 | 2,890 |
| c | $B_1$ | PG | 2.0/2.5 | 1,260 |
| d | $B_2$ | BG | 1.5/2.0 | 1,062 |
| f | $B_3$ | EG | 1.0/1.1 | 3,302 |
| g | $C_1$ | BG | 1.0/1.2 | 1,702 |
| k | $C_2$ | EG | 2.0/2.5 | 1,430 |
| l | $C_3$ | EG | 1.5/2.0 | 1,130 |
| m | $D_1$ | EG | 1.5/2.0 | 788 |
| p | $D_2$ | BG | 2.0/2.5 | 1,170 |
| q | $D_3$ | EG | 2.0/2.5 | 1,030 |

A: p,p′-biphenyldicarboxylic acid dimethylester
$B_1$: bis-(p-carboxyphenyl) methane dimethylester
$B_2$: 1,2-bis-(p-carboxyphenyl) ethane dimethylester
$B_3$: 1,4-bis-(p-carboxyphenyl) butane dimethylester
$C_1$: 1,2-bis-(p-carboxyphenoxy) ethane dimethylester
$C_2$: 1,3-bis-(p-carboxyphenoxy) propane dimethylester
$C_3$: 1,4-bis-(p-carboxyphenoxy) butane dimethylester
$D_1$: 1,5-naphthalenedicarboxylic acid dimethylester
$D_2$: 2,6-naphthalenedicarboxylic acid dimethylester
$D_3$: 2,7-naphthalenedicarboxylic acid dimethylester
EG: ethyleneglycol; PG: 1,3-propanediol
BG: 1,4-butanediol

TABLE IV

| Example | Composition (Mole ratio) |
|---|---|
| 15 | *a*/DEG/PEG 600/PPG 400/FA/AD (0.3/0.2/0.3/0.2/0.3/0.7) |
| 16 | *a*/PEG 1000/PPG 1200/1.4-BG/FA/GL/ML (0.5/0.2/0.2/0.1/0.5/0.1/0.4) |
| 17 | *b*/PEG 1000/PEPG 2000/PPG 400/FA/IA/IPA (0.3/0.2/0.3/0.2/0.6/0.2/0.2) |
| 18 | *c*/PEG 200/PEPG 1000/1,2-PG/PA/AC/MS/MM (0.4/0.1/0.4/0.1/0.3/0.1/0.3/0.3) |
| 19 | *d*/PEG 600/PPG 400/FA/SE/IPA (0.4/0.5/0.1/0.3/0.5/0.2) |
| 20 | *f*/PEG 1000/PEPG 1000/MA/CI/SU (0.3/0.4/0.3/0.5/0.1/0.4) |
| 21 | *g*/DEG/PEG 600/MAA/PAA/SU (0.3/0.1/0.6/0.3/0.1/0.6) |
| 22 | *k*/PEG 600/PPG 800/EG/MAA/SU (0.4/0.2/0.3/0.1/0.3/0.7) |
| 23 | *l*/PEG 600/PEPG 1000/MA/AD (0.5/0.1/0.4/0.4/0.6) |
| 24 | *m*/PEG 2000/1,2 -PG/MA/AD (0.5/0.15/0.35/0.3/0.7) |
| 25 | *p*/PEG 1000/PPG 400/PEG 1000/FA/IA/AD (0.2/0.2/0.2/0.2/0.3/0.1/0.6) |
| 26 | *p*/PPG 400/PEG 600/PEG 4000/FA/MU/SU) (0.2/0.25/0.3/0.05/0.4/0.1/0.5) |
| 27 | *q*/PEG 600/1,2-PG/FA/SU (0.4/0.5/0.1/0.2/0.8) |

Note: *a*, *b*, *c*, *d*, *f*, *g*, *k*, *l*, *m*, *p*, and *q* represent the corresponding esterdiol in Table IV respectively.

PEG 200, 600, 1,000, and 4,000 (= polyethyleneglycol having an average molecular weight of 200, 600, 1,000, and 4,000 respectively), PPG 400, 800, and 1,200 (= polypropyleneglycol having an average molecular weight of 400, 800, and 1,200 respectively), PEPG 1,000 and 2,000 [= copoly (oxyethyleneoxypropylene) glycol having an average molecular weight of 1,000 and 2,000 respectively ], PGB 1,000 (= polybutyleneglycol having an average molecular weight of 1,000), EG (= ethyleneglycol), 1,2-PG (= 1,2-propanediol), DEG (= diethyleneglycol), 1,4-BG (= 1,4-butanediol), MA (= maleic acid), MAA (= maleic anhydride), FA (= fumaric acid), CI (= citraconic acid), IA (= itaconic acid), GL (= glutaconic acid), MU (= acid), AC (= aconitic acid), SU (= succinic acid), MS (= methylsuccinic acid), ML (= acid), MM (= methylmalonic acid), AD (= adipic acid), SE′(= sebacic acid), PAA (= phthalic anhydride), IPA (= isophthalic acid)

EXAMPLES 28 TO 46

To 100 g. of the unsaturated polyester in Example 6, there were added 20 g. of a desired addition polymerizable ethylenically unsaturated monomer, 1.5 g. of benzoin methylether, 0.1 of Eosine G (C.I. 45380) and 50 mg. of p-methoxyphenol to produce a photosensitive composition. A sheet 2 mm. thick of the resulting photosensitive composition was exposed to the light from a 3 kw. carbon arc lamp for 30 minutes. The photocrosslinked sheet was immersed in a 1:1 by volume mixture of pyridine and dioxane for 24 hours and then dried sufficiently and weighed.

A hardening rate is defined by the following:

$$\text{Hardening rate} = \frac{\text{Weight before immersion} - \text{Weight after immersion}}{\text{Weight before immersion}} \times 100$$

In Table V the hardening rates are given.

TABLE V

| Example | Addition polymerizable, ethylenical unsaturated monomer | |
|---|---|---|
| 28 | acrylamide | 95 |
| 29 | methacrylamide | 90 |

| | | |
|---|---|---|
| 30 | N-methalol acrylamide | 93 |
| 31 | α-acetamide acrylamide | 82 |
| 32 | N,N'-methylenebis-acrylamide | 86 |
| 33 | N,N'-hexamethylenebis-acrylamide | 87 |
| 34 | N-vinylphthalamide | 81 |
| 35 | p-vinylphenol | 85 |
| 36 | 2,5-dihydroxystyrene | 85 |
| 37 | p-aminostyrene | 83 |
| 38 | p-vinyl benzoic acid | 84 |
| 29 | acrylic acid | 89 |
| 40 | methacrylic acid | 89 |
| 41 | α-chloroacrylic acid | 87 |
| 42 | diethyleneglycol dimeth-acrylate | 85 |
| 43 | triethyleneglycol dimeth-acrylate | 86 |
| 44 | ethyleneglycol diacrylate | 88 |
| 45 | diallylphthalate | 79 |
| 46 | styrene | 89 |

EXAMPLES 47 TO 50

To 100 g. of the unsaturated polyester in Example 14, there were added a desired amount of N-methylolacrylamide shown in Table VI, 2,0 g. of benzoin, 0.5 g. of anthraquinone and 50 mg. of hydroquinone to produce a photosensitive composition. A sheet of the resulting photosensitive composition was prepared in the same manner as in Example 1 and was exposed to the light from a 3 kw. carbon arc lamp for 15 minutes and then a hardening rate was measured in the same manner as in Examplés 28 to 46.

TABLE VI

| Example | N-methylolacrylamide (g) | Hardening rate (%) |
|---|---|---|
| 47 | 10 | 83 |
| 48 | 50 | 88 |
| 49 | 100 | 86 |
| 50 | 200 | 20 |

EXAMPLES 51 TO 59

To 100 g. of the unsaturated polyester in Example 3, there were added 20 of methacrylamide, 20 g. of N,N'-methylenebisacrylamide, 5 g. of methacrylic acid, 75 mg. of 2,5-di-tert-butyl hydroquinone and a desired amount of a variety of photosensitizers shown in Table VII to produce a photosensitive composition. From each resulting photosensitive composition a sheet was prepared and exposed to the light from a 3 kw. carbon arc lamp for 30 minutes in the same manner as in Examples 28 to 46. A photocrosslinking time when a hardening rate defined in Examples 28 to 46 attains above 80 percent are given in Table VII.

TABLE VII

| Example | Photosensitizer | Amount (g) | Photocrosslinking time (min.) |
|---|---|---|---|
| 51 | benzoin | 0.1 | 20 |
| 52 | benzoin | 1.0 | 5 |
| 53 | benzoin methylether | 1.0 | 5 |
| 54 | benzoin ethylether | 1.0 | 10 |
| 55 | α-methyl benzoin | 2.0 | 10 |
| 56 | diphenyl disulfide | 3.0 | 25 |
| 57 | 2-naphthalene sub fonyl chloride | 3.0 | 15 |
| 58 | diacetyl | 5.0 | 25 |
| 59 | benzophenone | 8.0 | 40 |

EXAMPLE 60

To 100 g. of the unsaturated polyester obtained in Example 1, there were added 20 g. of acrylamide, 20 g. of N,N'-methylenebisacrylamide and 2 g. of α-methylbenzoin to produce a composition (A). Further, compositions (B), (C) and (D) were prepared by adding p-methoxyphenol to the composition (A) in amounts of 0.005, 1.0 and 2.5 percent by weight, respectively. These compositions were left to stand in the dark room at 20° C. The thermal crosslinking of the composition (A) occurred after about 30 days and the composition (A) was not dissolved in a 0.5 percent aqueous sodium hydroxide. On the other hand the thermal crosslinking of the composition (B) hardly occurred after about 45 days and the composition (B) was dissolved in a 0.5 percent aqueous sodium hydroxide solution. The thermal crosslinking of the compositions (C) and (D) did not occur after about 90 days.

The compositions (C) and (D) after preparation were exposed to the light for 30 and 60 minutes respectively in the same manner as in Example 2. A hardening rate of the composition (C) defined in Examples 28 to 46 was about 87 percent while the one of the composition (D) was about 40 percent.

What is claimed is:

1. A photosensitive composition comprising (*a*) an unsaturated polyester, (*b*) 5 to 150 parts by weight, based on 100 parts by weight of said unsaturated polyester, of at least one addition polymerizable ethylenically unsaturated monomer containing at least one $$CH_2=C\langle$$

group and having a boiling point about 100° C. at normal atmospheric pressure and (*c*) 0.001 to 10 parts by weight, based on 100 parts by weight of said unsaturated, polyester of a photopolymerization initiator, said unsaturated polyester being prepared by the interpolymerization, polycondensation reaction of a diol component and an acid component in substantially stoichiometric amounts, wherein said diol component comprises an etherdiol (I) of the formula:

$$HO\!-\!\left(R_1\!-\!O\right)_x\!-\!H$$

wherein $R_1$ represents alkylene group having two to four carbon atoms; $x$ is 2 to 100 and 10 to 90 mole percent, based on the total diol content of an esterdiol (II) of the formula:

$$HO\!-\!\left[\left(CH_2\right)_y\!-\!O\!-\!\overset{O}{\overset{\|}{C}}\!-\!R_2\!-\!\overset{O}{\overset{\|}{C}}\!-\!O\right]_z\!\left(CH_2\right)_y\!-\!OH$$

wherein $R_2$ represents a member selected from the group consisting of:

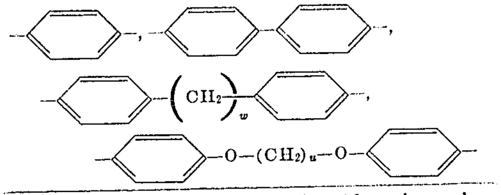

and naphthylene group, $y$ is 2 to 4; $z$ is 2 to 10; and $w$ and $u$ are respectively 1 to 4; and wherein said acid component comprises an unsaturated dicarboxylic acid, an anhydride thereof or a lower alcohol ester thereof.

2. A photosensitive composition as claimed in claim 1 wherein the ether diol I is a glycol selected from the group consisting of polyethyleneglycols having an average molecular weight of 106 to 4,000, polypropyleneglycols having an average molecular weight of 134 to 6,000, polybutyleneglycols having an average molecular weight of 162 to 8,000 and copoly (oxyethylene-oxypropylene) glycols having an average molecular weight of 120 to 10,000.

3. A photosensitive composition as claimed in claim 1 wherein the ester diol II is the polyester produced by the condensation of a compound selected from the group consisting of terephthalic acid, p,p'-biphenyldicarboxylic acid, bis-(p-carboxyphenyl) methane, 1,2bis-p-carboxyphenyl) ethane, 1,3-bis-(p-carboxyphenyl) propane, 1,4-bis-(bis-(p-carboxyphenyl) butane, 1,2-bis-(p-carboxyphenoxy) ethane, 1,3-bis- (p-carboxyphenoxy) propane, 1,4-bis-(p-carboxyphenoxy) butane, 1,5-naphthalene dicarboxylic acid, 2,7-naphthalene dicarboxylic acid, 2,6-naphthalene dicarboxylic acid and dimethyl- and diethylesters thereof with a diol selected from the group consisting of ethyleneglycol, 1,3-propanediol and 1,4-butanediol.

4. A photosensitive composition as claimed in claim 1 wherein said unsaturated dicarboxylic acid is selected from the group consisting of maleic acid, fumaric acid, citraconic acid, methaconic acid, itaconic acid, glutaconic acid, muconic acid, aconitic acid and dimethyl- and diethylesters thereof.

5. A photosensitive composition as claimed in claim 1 wherein at most 90 mole percent of the ether diol (I) is admixed with a diol (IV) selected from the group consisting of ethyleneglycol, 1,2-propanediol, 1,3 propanediol and 1,4-butanediol.

6. A photosensitive composition as claimed in claim 1 wherein at most 90 mole percent of the unsaturated dicarboxylic acid is admixed with a saturated dicarboxylic acid selected from the group consisting of oxalic acid, malonic acid, methylmalonic acid, succinic acid, glutaric acid, sebacic acid, phthalic acid, isophthalic acid, terephthalic acid and dimethyl and diethylesters thereof.

7. A photosensitive composition as claimed in claim 6 wherein at most 90 mole percent of the ether diol (I) is admixed with a diol selected from the group consisting of ethyleneglycol, 1,2-propanediol, 1,3-propanediol, and 1,4-butanediol.

8. A photosensitive composition as claimed in claim 1 which comprises 0.005 to 2.0 parts by weight, based on 100 parts by weight of the total of (*a*) the unsaturated polyester and (*b*) the addition polymerizable ethylenically unsaturated monomer, of a thermal polymerization inhibitor.

* * * * *

PO-1050
(5/69)

UNITED STATES PATENT OFFICE
CERTIFICATE OF CORRECTION

Patent No. 3,644,120 Dated February 22, 1972

Inventor(s)

It is certified that error appears in the above-identified patent and that said Letters Patent are hereby corrected as shown below:

Column 1, line 40, "chemistry" should read --chemical--

Column 2, line 45, formula, "$CH_2)^2$" and "$CH_2)^2$" should read --$(CH_2)_{\underline{w}}$-- and --$CH_2)_{\underline{u}}$ --, respectively Column 3, line 10, at end of formula, insert --and--

Column 6, line 72, "THe" should be --The--

Signed and sealed this 3rd day of October 1972.

(SEAL)
Attest:

EDWARD M.FLETCHER,JR.
Attesting Officer

ROBERT GOTTSCHALK
Commissioner of Patents